United States Patent [19]

Kawabata et al.

[11] Patent Number: 4,766,055
[45] Date of Patent: Aug. 23, 1988

[54] PHOTOPOLYMERIZABLE COMPOSITION CONTAINING A CERTAIN XANTHENE OR THIOXANTHENE DYESTUFF

[75] Inventors: Masami Kawabata, Suita; Koichi Kimoto, Hirakata; Yasuyuki Takimoto, Takatsuki, all of Japan

[73] Assignee: Nippon Paint Co., Ltd., Osaka, Japan

[21] Appl. No.: 892,076

[22] Filed: Aug. 1, 1986

[30] Foreign Application Priority Data

Aug. 1, 1985 [JP] Japan ................................ 60-170600
Mar. 7, 1986 [JP] Japan ................................ 61-51027

[51] Int. Cl.⁴ ............................................... G03C 1/68
[52] U.S. Cl. ................................... 430/281; 430/916; 430/920; 430/922; 430/923; 430/915; 430/926; 522/24
[58] Field of Search .................. 522/24; 430/916, 920, 430/922, 923, 915, 926, 281

[56] References Cited

FOREIGN PATENT DOCUMENTS 0189340 10/1984 Japan ................................ 430/281

*Primary Examiner*—Paul R. Michl
*Assistant Examiner*—Cynthia Hamilton
*Attorney, Agent, or Firm*—Wenderoth, Lind & Ponack

[57] ABSTRACT

Disclosed is a photopolymerizable composition which is very sensitive to visible light. The composition comprises a polymerizable compound and a photopolymerization initiator wherein the photopolymerization initiator comprises (a) a particular xanthene or thioxanthene dyestuff, (b) a photosensitizer selected from the group consisting of N-phenylglycine, 2,4,6-tris(trichloromethyl)-1,3,5-triazine, and a mixture of p-dimethylaminobenzoic acid isopentyl ester and 2,4-diisopropylthioxanthone, and (c) a peroxide.

10 Claims, No Drawings

PHOTOPOLYMERIZABLE COMPOSITION CONTAINING A CERTAIN XANTHENE OR THIOXANTHENE DYESTUFF

FIELD OF THE INVENTION

The present invention relates to a photopolymerizable composition which is cured by exposing to light sources containing visible light or ultraviolet light. More particularly, the present invention relates to a photopolymerizable composition applicable to a litho printing plate, a resist for producing a printed circuit board, or an original edition for preparing a mother plate for a rainbow hologram.

BACKGROUND OF THE INVENTION

For an image formation by way of a photographical technique, there has been employed a photosensitive composition comprising a photosensitive component such as diazonium salts, azides or quinonediazides, or a photo hardening composition comprising a photocrosslinkable component. Most of these compositions are sensitive to ultraviolet light but not sensitive to visible light. This is a problem to be solved because it is desired that printing is carried out by exposing with visible light in lieu of ultraviolet.

Scanning exposure techniques with laser beams have recently progressed so that it should be taken into consideration that these scanning exposure techniques are applied to imaging techniques. Especially, the use of a visible light laser, such as an argon laser, is more desired because of the aspect of energy and equipment cost. Accordingly, a composition more sensitive to visible light is strongly desired.

Japanese Patent Publication No. 114139/1982 and Japanese Patent Application Ser. No. 170599/1985 disclose a photopolymerizable composition sensitive to a visible light having a wave length of 400 to 700 nm, wherein a dyestuff is combined with a photosensitizer. These photopolymerizable compositions are still insufficient in sensitivity to visible light and therefore, when applied to an imaging technique using laser scanning system, require a high output power laser which costs much. Accordingly, further improvement of sensitivity is required.

It has been found that a kind of xanthene or thioxanthene dyestuff is very sensitive to visible light when combined with a polymerizable monomer, a photosensitizer and an organic peroxide. It also has been found that a cured composition exibits excellent physical properties for the use mentioned in the field of the invention.

SUMMARY OF THE INVENTION

The present invention provides a photopolymerizable composition which is very sensitive to visible light. The composition comprises a polymerizable compound and a photopolymerization initiator wherein the photopolymerization initiator comprises:

(a) a xanthene or thioxanthene dyestuff having the following formula:

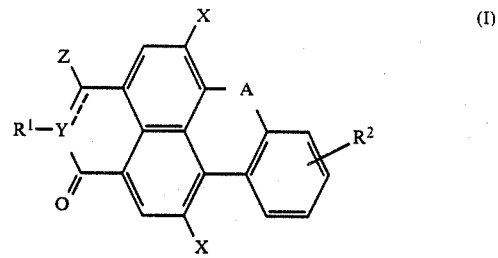

wherein A represents an oxygen atom or a sulfur atom, X represents a hydrogen atom or a halogen atom, Y represents a carbon atom or a nitrogen atom (provided that when Y represents a carbon atom, the bond with an adjacent carbon atom, which is shown by a dotted line, is a double bond and when Y represents a nitrogen atom, the bond with the adjacent carbon atom is a single bond), Z represents an oxygen atom wherein the bond with an adjacent carbon atom is a double bond, a loweralkoxy group or a lower alkanoyloxy group, $R^1$ represents a lower alkyl group, a hydroxy-loweralkyl group, a loweralkoxy loweralkyl group, a di-loweralkylamino loweralkyl group or an aryl group, $R^2$ represents a hydrogen atom, a lower alkoxy group or di-loweralkylamino group, together represent Z and $R^1$ presents together the formula;

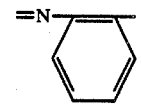

(b) a photosensitizer selected from the group consisting of N-phenylglycine, 2,4,6-tris(trichloromethyl)-1,3,5-triazine, and a mixture of p-dimethylaminobenzoic acid isopentyl ester and 2,4-diisopropylthioxanthone, and (c) a peroxide.

DETAILED DESCRIPTION OF THE PRESENT INVENTION

The polymerizable compound of the present invention is usually a monomer having an ethylenically unsaturated bond, by which an addition polymerization occurs to cause curing. The compound preferably has a boiling point of at least 100° C.

Typical examples of the polymerizable compounds are an unsaturated carboxylic acid, an ester of unsaturated carboxylic acids and polyhydroxy compounds, and the like. The polyhydroxy compounds include aliphatic or aromatic polyhydroxy compounds, and a mixture thereof. A polycarboxylic acid which does not have an unsaturated bond can be mixed with the unsaturated carboxylic acid. Examples of unsaturated carboxylic acids are acrylic acid, methacrylic acid, itaconic acid, crotonic acid, maleic acid and the like. Examples of aliphatic polyhydroxy compounds are diols, such as ethylene glycol, diethylene glycol, triethylene glycol, tetraethylene glycol, neopentyl glycol, propylene glycol, 1,2-butanediol and the like; triols, such as trimethylolethane, trimethylolpropane, glycerol and the like; higer polyols, such as pentaerythritol, tripentaerythritol and the like; and polyhydroxycarboxylic acids. Examples of aromatic polyhydroxy compounds are hydroquinone, resorcine, catechol, pyrogallol and the like. Examples of polycarboxylic acids without an unsaturated bond are phthalic acid, isophthalic acid, terephthalic acid, tetrachlorophthalic acid, trimellitic acid, pyromellitic acid, benzophenone dicarboxylic acid, glutaric acid, adipic acid, sebacic acid, tetrahydrophthalic acid and the like.

Examples of esters of aliphatic polyhydroxy compounds and unsaturated carboxylic acids are acrylates, such as ethylene glycol diacrylate, triethylene glycol diacrylate, tetramethylene glycol diacrylate, trimethylolpropane triacrylate, trimethylolethane triacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, tripentaerythritol octaacrylate, glycelol diacrylate; methacrylates, such as triethylene glycol dimethacrylate, tetramethylene glycol dimethacrylate, trimethylolpropane trimethacrylate, trimethylolethane trimethacrylate, pentaerythritol dimethacrylate, pentaerythritol trimethacrylate, pentaerythritol tetramethacrylate, dipentaetythritol dimethacrylate, dipentaerythritol trimethacrylate, dipentaerythritol tetramethacrylate, tripentaerythritol octamethacrylate, ethylene glycol dimethacrylate, 1,2-butanediol dimethacrylate, solbitol tetramethacrylate and the like; itaconates, such as ethylene glycol diitaconate, propylene glycol diitaconate, 1,2-butanediol diitaconate, tetramethylene glycol diitaconate, pentaerythritol triitaconate and the like; crotonates such as ethylene glycol dicrotonate, diethylene glycol dicrotonate, pentaerythritol tetracrotonate and the like; and maleates, such as ethylene glycol dimaleate, triethylene glycol dimaleate, pentaerythritol dimaleate and the like. Examples of esters of unsaturated carboxylic acids and aromatic polyhydroxy compounds are hydroquinone diacrylate, hydroquinone dimethacrylate, resorcinol diacrylate, resorcinol dimethacrylate, pyrogallol triacrylate and the like. The esters which are obtained by an esterification of polyhydroxy compounds and a mixture of unsaturated carboxylic acids and polyhydric carboxylic acids are not always a single compound and may include the following;

Z'—OC₂H₄—OOC—C₆H₄—COO—C₂H₄O—Z'
Z'—(OC₂H₄)₂—OOC—(CH₂)₄—COO—(C₂H₄O)₂—Z'
Z'—(OC₂H₄)₃—OOC—CH=CH—COO—(C₂H₄O)₃—Z'

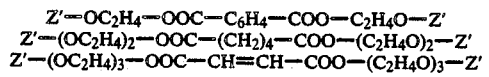

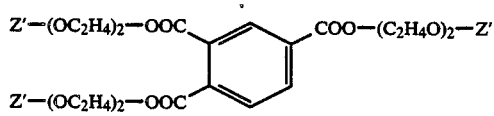

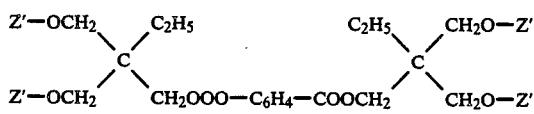

Z'—OC₂H₄—OOC—C₆H₄—COO—C₂H₄—OH

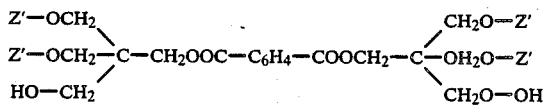

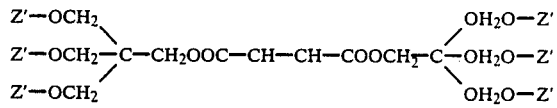

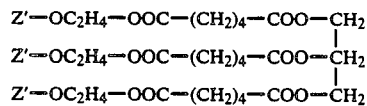

Z'—OC₂H₄—OOC—(CH₂)₄—COO—CH₂
Z'—OC₂H₄—OOC—(CH₂)₄—COO—CH₂
Z'—OC₂H₄—OOC—(CH₂)₄—COO—CH₂ wherein Z' represents an acryloyl group or methacryloyl group.

Beside above compounds, the polymerizable compounds includes acrylamides, such as acrylamide, ethylene-bis-acrylamide, hexamethylene-bis-acrylamide and the like; methacrylamides, such as ethylene-bis-methacrylamide, hexamethylene-bis-methacrylamide and the like; allyl esters, such as diallyl phthalate, diallyl malonate, diallyl fumarate, triallyl isocyanurate; and vinyl-containing compounds, such as divinyl adipate, divinyl phthalate, ethyleneglycol divinyl ether and the like.

The polymerizable compound may be a polymer having an unsaturated bond therein. Where the polymerizable compound is a polymer having an ethylenically unsaturated bond, the unsaturated bond may be either in a main chain or branch. The polymer having an ethylenically unsaturated bond in a main chain includes a polyester obtained from a condensation reaction of an unsaturated dicarboxylic acid and a dihydroxy compound, and a polyamide obtained from a condensation polymerization of an unsaturated dicarboxylic acid and a diamine. Examples of unsaturated dicarboxylic acids are maleic acid, fumaric acid and the like. The polymer having a ethylenically unsaturated bond in a branch chain includes a polyester prepared from a condensation reaction of a dicarboxylic acid having an unsaturated bond in a branch and a dihydroxy compound, a polyamide prepared from a condensation reaction of the dicarboxylic acid having an unsaturated bond in a branch and a diamine and the like. Examples of the dicarboxylic acids having an unsaturated bond are itaconic acid, α-methylitaconic acid, γ-methylitaconic acid, propylidenesuccinic acid, α-ethylideneglutaric acid, ethylidenemalonic acid, propylidenemalonic acid and the like. The polymer having an unsaturated bond in a branch can be prepared by introducing unsaturated groups to a polymer having at least one reactive functional group, such as hydroxy or halogenized alkyl. Examples of the polymers having functional groups are polyvinyl alcohol; a copolymer of polyvinyl alcohol and a copolymerizable monomer such as acrylonitril, vinyl chloride, styrene, vinylidene chloride and the like; polyepichlorohydrine; a copolymer of 2-hydroxyethyl methacrylate with acrylonitrile, methylmethacrylate, butyl methacrylate, styrene, vinylidene chloride, vinyl acetate and the like; a polyether prepared from the reaction of epichlorohydrine and 2,2-bis(4-hydroxyphenyl)-propane, poly(4-hydroxystyrene), poly(N-methylolacrylamide) and the like. The compound for introducing unsaturated groups includes acrylic acid, methacrylic acid, crotonic acid and the like.

Among the above polymerizable compounds, preferred are acrylate monomers and methacrylate monomers.

According to the present invention, the photopolymerization initiator contains a xanthene or thioxanthene compound (I). In the formula, a typical example of X is chlorine, bromine and the like. Examples of the lower alkoxy groups represented by Z are methoxy, ethoxy, propoxy, and the like and the lower alkanoyloxy groups are acetyloxy, propionyloxy, butylyloxy and the like. Examples of $R_1$ are a lower alkyl group, such as methyl, ethyl, propyl, butyl, pentyl, hexyl, heptyl, octyl, nonyl, decyl and the like; a hydroxy lower alkyl group, such as hydroxymethyl, hydroxyethyl, hydroxypropyl, hydroxybutyl and the like; a lower alkoxy lower alkyl group, such as methoxymethyl, methoxyethyl, methoxypropyl, ethoxyethyl, ethoxypropyl, ethoxybutyl, propoxyethyl, propoxypropyl and the like; a di-lower alkyl amino lower alkyl group, such as dimethylaminomethyl, dimethylaminoethyl, dimethylaminopropyl, diethylaminoethyl, diethylaminopropyl, diethylaminobutyl and the like; and an aryl group, such as phenyl, xylyl, tolyl, naphthyl and the like. Examples of $R^2$ are a lower alkoxy group, such as methoxy, ethoxy, propoxy, and the like; di-lower alkylamino group, such as dimethylamino, diethylamino and the like. The xanthene or thioxanthene dyestuff (I) is already known in the art.

In the present invention, the photopolymerization initiator further contains a photosensitizer, by which senstivity to light sources is enhanced so as to complete curing in a short period of time. Examples of the photosensitizers are N-phenylglycine, 2,4,6-tris(trichloromethyl)-1,3,5-triazine, and a mixture of 2,4-diisopropylthioxanthone and p-dimethylaminobenzoic acid isopentylester.

The photopolymerization initiator of the present invention contains a peroxide. The preferred peroxides are selected from the group consisting of ketone peroxides, peroxy ketals, hydroperoxides, dialkyl peroxides, diacyl peroxides, peroxy dicarbonates, peroxy esters and the like. Typical examples of the peroxides are methyl ethyl ketone peroxide, cyclohexanone peroxide, 3,3,5-trimethylhexanone peroxide, methylcyclohexanone peroxide, acetyacetone peroxide, 1,1-bis(t-butyl peroxy)-3,3,5-trimethylcyclohexane, 1,1-bis(t-butyl peroxy)cyclohexane, n-butyl-4,4-bis(t-butyl peroxy)valerate, 2,2-bis(t-butyl peroxy)butane, t-butyl hydroperoxide, cumen hydroperoxide, diisopropylbenzen hydroperoxide, paramenthane hydroperoxide, 2,5-dimethylhexane-2,5-dihydroperoxide, 1,1,3,3-tetramethylbutyl hydroperoxide, di-t-butyl peroxide, t-butyl cumyl peroxide, dicumyl peroxide, $\alpha,\alpha'$-bis(t-butyl peroxy isopropyl)benzene, 2,5-dimethyl-2,5-di(t-butyl peroxy)-hexane, 2,5-dimethyl-2,5-di(t-butyl peroxy)hexyn-3, acetyl peroxide, isobutylyl peroxide, octonoyl peroxide, decanoyl peroxide, lauroyl peroxide, 3,5,5-trimethyl hexanoyl peroxide, peroxysuccinic acid, benzoyl peroxide, 2,4-dichlorobenzoyl peroxide, m-toluoyl peroxide, diisopropyl peroxy dicarbonate, di-2-ethyl hexyl peroxy dicarbonate, di-2-ethoxy ethyl peroxy dicarbonate, dimethoxy isopropyl peroxy carbonate, di(3-methyl-3-methoxybutyl)peroxy dicarbonate, t-butyl peroxy pivalate, t-butyl peroxy neodecanoate, t-butyl peroxy octanoate, t-butyl peroxy-3,5,5-trimethyl hexanoate, t-butyl peroxy laurate, t-butyl peroxy benzoate, di-t-butyl peroxy isophtharate, 2,5-dimethyl-2,5-di(benzoyl peroxy)-hexane, t-butyl peroxy melain, t-butyl peroxy isopropyl carbonate and the like.

The xanthene or thioxanthene dyestuff is present in the composition in an amount of 0.005 to 0.3 part by weight, preferably 0.02 to 0.1 part by weight based on one part by weight of the polymerizable compound.

The amount of the photosensitizer is within the range of 0.005 to 0.3 part by weight, preferably 0.02 to 0.1 part by weight based on one part by weight by the polymerizable compound, wherein, where the mixture of p-dimethylaminobenzoic acid isopentyl ester and 2,4-diisopropylthioxantone is employed, a total amount is used. The mixture is prepared by mixing 0.1 to 1.5 parts by weight, preferably 0.3 to 1 part by weight of 2,4-diisopropylthixanthone with one part by weight of p-dimethylaminobenzoic acid isopentyl ester. The peroxide is present in the composition in an amount of 0.005 to 0.2 part by weight, preferably 0.01 to 0.08 part by weight based on one part by weight of the polymerizable compound. Amounts less than the lower limit of each component do not impart the required photosensitivity to the composition. Amounts more than the upper limit of each component result in a cured material of lower molecular weight, causing decline of film hardness, solvent-resistance and the like.

The photopolymerizable composition of the present invention may contain polymeric binders, heat-polymerization inhibitors, plasticizers and coloring agents, if desired. The polymeric binders are those improving compatibility, film-forming ability, developing capability, and adhesive property. Typical examples of the polymeric binders are an acrylic acid copolymer; a methacrylic acid copolymer; an itaconic acid copolymer; a partially esterified maleic acid copolymer; a modified acidic cellulose having a branched carboxyl group; a polyethylene oxide; a polyvinylpyrrolidone; a polyether of epichlorohydrine and 2,2-bis(4-hydroxyphenyl)propane; a polyamide; an alkyl poly(meth)acrylate such as poly(methyl(meth)acrylate); a copolymer of an alkyl acrylate with acrylonitrile, acrylic acid, methacrylic acid, vinyl chloride, vinylidene chloride, styrene and the like; a copolymer of acrylonitrile with vinyl chloride, or vinylidene chloride; a copolymer of vinyl acetate with vinylidene chloride, a chlorinated polyolefin, or vinyl chloride; polyvinyl acetate; a styrene-acrylonitrile copolymer; ABS, polyvinyl alkyl ether, a polyvinyl alkyl ketone, polystyrene, polyamide, polyurethane, polyethylene terephthalate, polyethylene isophthalate, acetylcellulose, polyvinyl butyral and the like. The binder may be present in the composition in an amount of not more than 10 parts by weight, preferably 0.5 to 3 parts by weight based on one part by weight of the polymerizable compound.

The heat polymerization inhibitor includes hydroquinone, p-methoxyphenol, pyrogallol, catechol, 2,6-di-t-butyl-p-cresol, $\beta$ naphthol and the like. These inhibitors are present in an amount of 0.01 to 3 parts by weight based on the total amount of the polymerizable compound and the polymeric binder.

The coloring agents include pigments such as phthalocyanine pigments, azo pigments, carbon black, titanium oxides, and the like; and dyes such as triphenylmethane dyes, azo dyes, and anthraquinone dyes. These coloring agents are present in an amount of 0.001 to 10 parts by weight of the total amount of the polymerizable compound and the polymeric binder.

The plasticizer which may contained in the photopolymerizable composition of the present invention includes dioctyl phthalate, didodecyl phthalate, dibutylphthalate, butylbenzyl phthalate, triethyleneglycol dicaprylate, dimethylglycol phthalate, tricresyl phosphate, dioctyl adipate, dibutyl adipate, dibutyl sebacate, dibutyl maleate, triacetylglycerol and the like. The amount of the plasticizer is up to 5% by weight based on the total amount of the polymerizable compound and the polymeric binder.

In order to form a photosensitive resin layer on a substrate from the photopolymerizable composition mentioned above, the composition can be applied on the substrate directly or after dissolving in a suitable solvent followed by drying it. Suitable solvents are methyl ethyl ketone, acetone, cyclohexane, ethyl acetate, butyl acetate, amyl acetate, ethyl propionate, toluene, xylene, benzene, monochlorobenzene, chloroform, carbon tetrachloride, trichloroethylene, trichloroethane, dimethylformamide, methyl cellosolve, ethyl cellosolve, tetrahydrofuran, pentoquinone, methanol, ethanol, propanol and the like.

The photosensitive resin layer is optionally subjected to a known treatment in order to prevent decline of sensitivity and storage stability due to oxygen. For example, the resin layer may be covered by a removable transparent sheet or provided with a coating of wax having low permeability of oxygen or of a water-soluble or alkaline water-soluble polymer.

The photosensitive resin layer can be exposed to cure with a conventional light source containing ultraviolet or visible light having a wave length of at least 180 nm, such as a carbon arc, a high pressure mercury lamp, a xenone lamp, a metal halide lamp, a fluorescent lamp, a tungsten lamp, an argon ion laser, a helium-cadmium laser, a krypton laser and the like. Preferred are lasers, because they can simultaneously accomplish the formation of image and the curing. Development after curing may be carried out by dissolving an uncured portion with a developing solution which can be selected depending on the kind of the photosensitive resin layer.

EXAMPLES

The present invention is illustrated by the following examples, but they are not to be construed as limiting the present invention.

EXAMPLE 1

Preparation of photopolymerizable composition

One gram of the copolymer of methyl methacrylate and methacrylic acid (available from Mitsubishi Rayon Co., Ltd. as BR-77) was dissolved in 10 g of methyl ethyl ketone, followed by adding 1.0 g of pentaerythritol triacrylate (available from Osaka Organic Chemical Ind. Ltd.) to form a first solution. Next, 60 mg of a thioxanthene dyestuff (A=S; X=H; Y=C; Z=$OC_2H_5$; $R^1$=$C_6H_5$; $R^2$=H), 60 mg of di-t-butyl peroxy isophthalate, 30 mg of N-phenylglycine and 10 mg of methoquinone(p-methoxyphenol) were dissolved in 3 g of methyl cellosolve to form a second solution. The first and second solution were mixed to form a photopolymerizable composition.

Preparation of photosensitive resin layer (test panel)

The composition obtained above was coated on an aluminum substrate in a coating amount of 2 g/m$^2$ by using a bar coater and dried at 60° C. for three minutes to obtain a photosensitive layer on the substrate having a thickness of 2.0 μm. An overcoat layer having a thickness of 2.0 μm was formed on the photosensitive layer by coating a 5% solution of polyvinyl alchol (saponification degree 88%; polymerization degree 500) with a bar coater.

Photosensitivity

The obtained panel was covered with Kodak Step Tablet No. 2 (21 steps) followed by exposing for ten seconds to a light having a wave length of around 490 nm and a light intensity of 4.0 mW/cm$^2$, obtained from a xenone lamp of 150 W (available from Ushio Electric Co. Ltd.) through a filter. It was then developed with a developing solution containing 10 parts by weight of sodium hydrogencarbonate, 50 parts by weight of butyl cellosolve, 3 parts by weight of a surfactant and 1,000 parts by weight of water, to result in 15 steps being cured. As appeared from the above result, it has been found that the tested panel can form cured images with an exposure of 0.3 mJ/cm$^2$.

Argon ion laser sensitivity

Spot exposing was made to the obtained panel by changing intensity and exposing period of an argon ion laser having a wave length of 488 nm and a beam diameter of 1.25 mm, followed by developing with the developing solution mentioned above. The laser sensitivity of this panel was 0.65 mJ/cm$^2$. By laser sensitivity herein is meant an energy required to obtain a spot having 1.25 mm diameter.

Next, the test panel was exposed by cylindrically scanning a laser light (488 nm) with modulating by a modulator (1,000 rpm, 600 lines/inch), wherein the laser light was one condensed into a beam diameter of 20μ from a 0.5 W argon ion laser light source through an optical system. The plate was then developed with the developing solution to obtain a clear image.

COMPARATIVE EXAMPLE 1-1

A photopolymerizable composition was prepared as generally described in Example 1 with the exception that N-phenylglycine was not employed. Photosensitivity was measured as generally described in Example 1 to find that 11 steps were cured. From the result, it has been found that the plate can form images with an exposure of 1.1 mJ/cm$^2$.

The laser sensitivity of the plate was 2.80 mJ/cm$^2$. An image obtained by cylindrical scanning of the argon laser as described in Example 1 was less clear than the plate of Example 1.

COMPARATIVE EXAMPLE 1-2

A photopolymerizable composition was prepared as generally described in Example 1 with the exception that 60 mg of di-t-butyl peroxy isophthalate was not employed. Photosensitivity was measured as generally described in Example 1 to find that 10 steps were cured. From the result, it has been found that the plate can form images with an exposure of 1.6 mJ/cm$^2$.

The laser sensitivity of the plate was 2.94 mJ/cm$^2$. An image obtained by cylindrical scanning of the argon laser as described in Example 1 was less clear than the plate of Example 1.

COMPARATIVE EXAMPLE 1-3

A photopolymerizable composition was prepared as generally described in Example 1 with the exception that 90 mg of di-t-butyl peroxy isophthalate was employed instead of 60 mg of it and N-phenylglycine was not employed. Photosensitivity was measured as generally described in Example 1 to find that 11 steps were cured. From the result, it has been found that the plate can form images with an exposure of 1.1 mJ/cm$^2$.

The laser sensitivity of the plate was 2.95 mJ/cm². An image obtained by cylindrical scanning of the argon laser as described in Example 1 was less clear than the plate of Example 1.

COMPARATIVE EXAMPLE 1-4

A photopolymerizable composition was prepared as generally described in Example 1 with the exception that 60 mg of di-t-butyl peroxy isophthalate was not employed and 90 mg of N-phenylglycine was employed instead of 30 mg of it. Photosensitivity was measured as generally described in Example 1 to find that 10-11 steps were cured. From the result, it has been found that the plate can form images with an exposure of 1.4 mJ/cm².

The laser sensitivity of the plate was 2.90 mJ/cm². An image obtained by cylindrical scanning of the argon laser as described in Example 1 was less clear than the plate of Example 1.

EXAMPLE 2

A sample panel was obtained as generally described with the exception that 60 mg of a xanthen dyestuff (A=O; X=Cl; Y=N; Z=O; $R^1$=$C_2H_5O(CH_2)_3$; $R^2$=$N(C_2H_5)_2$) was employed as a dyestuff. Photosensitivity was measured as generally described in Example 1 to find that 16 steps were cured. From the result, it has been found that the plate can form images with an exposure of 0.2 mJ/cm².

The laser sensitivity of the plate was 0.60 mJ/cm². An image obtained by cylindrical scanning of the argon laser as described in Example 1 was as clear as the plate of Example 1.

COMPARATIVE EXAMPLE 2-1

A photopolymerizable composition was prepared as generally described in Example 2 with the exception that N-phenylglycine was not employed. Photosensitivity was measured as generally described in Example 2 to find that 12 steps were cured. From the result of it, it has been found that the plate can form images with an exposure of 0.8 mJ/cm².

The laser sensitivity of the plate was 2.52 mJ/cm². An image obtained by cylindrical scanning of the argon laser as described in Example 2 was less clear than the plate of Example 2.

COMPARATIVE EXAMPLE 2-2

A photopolymerizable composition was prepared as generally described in Example 2 with the exception that 60 mg of di-t-butyl peroxy isophthalate was not employed. Photosensitivity was measured as generally described in Example 2 to find that 11 steps were cured. From the result, it has been found that the plate can form images with an exposure of 1.1 mJ/cm².

The laser sensitivity of the plate was 2.80 mJ/cm². An image obtained by cylindrical scanning of the argon laser as described in Example 2 was less clear than the plate of Example 2.

EXAMPLE 3 AND COMPARATIVE EXAMPLE 3

A test panel was prepared as generally described in Example 1 with the exception that 30 mg of 2,4,6-tris(-trichloromethyl)-1,3,5-triazine was employed instead of N-phenylglycine. Photosensitivity was measured as generally described in Example 1 to find that 15 steps were cured. From the result, it has been found that the plate can form images with an exposure of 0.3 mJ/cm².

The laser sensitivity of the plate was 0.72 mJ/cm². An image obtained by cylindrical scanning of the argon laser as described in Example 1 was as clear as the plate of Example 1.

For a comparison, a photopolymerizable composition was prepared as generally described in Example 1 with the exception that di-t-butyl peroxy isophthalate was not employed. Photosensitivity was measured as generally described in Example 1 to find that 11 steps were cured. From the result, it has been found that the plate can form images with an exposure of 1.12 mJ/cm².

The laser sensitivity of the plate was 2.80 mJ/cm². An image obtained by cylindrical scanning of the argon laser as described in Example 3 was less clear than the plate of Example 3.

EXAMPLE 4 AND COMPARATIVE EXAMPLE 4

A test panel was prepared as generally described in Example 1 with the exception that 30 mg of p-dimethylaminobenzoic acid isopentyl ester and 15 mg of 2,4-diisopropylthioxantone were employed instead of N-phenylglycine. Photosensitivity was measured as generally described in Example 1 to find that 14 steps were cured. From the result, it has been found that the plate can form images with an exposure of 0.4 mJ/cm².

The laser sensitivity of the plate was 1.08 mJ/cm². An image obtained by cylindrical scanning of the argon laser as described in Example 1 was slightly less clear than the plate of Example 1, but it can be usable in good condition.

For a comparison, a photopolymerizable composition was prepared as generally described mentioned above with the exception that di-t-butyl peroxy isophthalate was not employed. Photosensitivity was measured as generally described in Example 1 to find that 9 steps were cured. From the result, it has been found that the plate can form images with an exposure of 2.24 mJ/cm².

The laser sensitivity of the plate was 4.35 mJ/cm². An image obtained by cylindrical scanning of the argon laser as described in Example 4 was less clear than the plate of Example 4.

EXAMPLE 5 AND COMPARATIVE EXAMPLE 5

A photopolymerizable composition was prepared as generally described in Example 1 with the exception that 60 mg of 2,5-dimethyl-2,5-di(benzoyl peroxy)hexane was employed instead of di-t-butyl peroxy isophthalate. Photosensitivity was measured as generally described in Example 1 to find that 16 steps were cured. From the result of it, it has been found that the plate can form images with an exposure of 0.2 mJ/cm².

The laser sensitivity of the plate was 0.65 mJ/cm². An image obtained by cylindrical scanning of the argon laser as described in Example 1 was as clear as the plate of Example 1.

For a comparison, a photopolymerizable composition was prepared as generally described in the above Example 5 with the exception that N-phenylglycine was not employed. Photosensitivity was measured as generally described in Example 1 to find that 12 steps were cured. From the result, it has been found that the plate can form images with an exposure of 0.8 mJ/cm².

The laser sensitivity of the plate was 2.41 mJ/cm². An image obtained by cylindrical scanning of the argon laser as described in Example 5 was less clear than the plate of Example 5.

EXAMPLE 6

A test panel was prepared as generally described in Example 1 with the exception that 60 mg of N-phenylglycine was employed. Photosensitivity was measured as generally described in Example 1 to find that 15 steps were cured. From the result, it has been found that the plate can form images with an exposure of 0.3 mJ/cm$^2$.

The laser sensitivity of the plate was 0.83 mJ/cm$^2$. An image obtained by cylindrical scanning of the argon laser as described in Example 6 was as clear as the plate of Example 6.

What is claimed is:

1. A photopolymerizable composition comprising a polymerizable compound and a photopolymerization initiator, wherein the photopolymerization initiator comprises:

(a) a xanthene or thioxanthene dyestuff having the formula

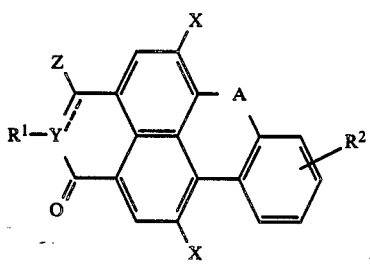

wherein A represents an oxygen atom or a sulfur atom, X represents a hydrogen atom or a halogen atom, Y represents a carbon atom or a nitrogen atom, provided that when Y represents a carbon atom the bond with the adjacent carbon atom which is shown by the dotted line is a double bond, and when Y represents a nitrogen atom the bond with the adjacent carbon atom is a single bond, Z represents an oxygen atom wherein the bond with the adjacent carbon atom is a double bond, a lower alkoxy group or a lower alkanoyloxy group, R$^1$ represents a lower alkyl group, a hydroxy lower alkyl group, a lower alkoxy lower alkyl group, a di-lower alkylamino lower alkyl group or an aryl group, R$^2$ represents a hydrogen atom, a lower alkoxy group or a di- lower alkylamino group, or Z and R$^1$ together represent the formula

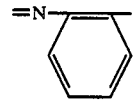

(b) a photosensitizer selected from the group consisting of N-phenylglycine, 2,4,6-tris(trichloromethyl)-1,3,5-triazine, and a mixture of p-dimethylaminobenzoic acid isopentyl ester and 2,4-diisopropylthioxanthone, and (c) a peroxide.

2. The composition of claim 1 wherein in the xanthene or thioxanthene dyestuff, A represents an oxygen atom or a sulfur atom, X represents a hydrogen atom or a halogen atom, Y represents a carbon atom or a nitrogen atom, provided that when Y represents a carbon atom the bond with the adjacent carbon atom which is shown by the dotted line is a double bond, and when Y represents a nitrogen atom the bond with the adjacent carbon atom is a single bond, Z represents an oxygen atom wherein the bond with the adjacent carbon atom is a double bond, a $C_1$-$C_3$ alkoxy group or a $C_2$-$C_4$ alkanoyloxy group, R$^1$ represents a $C_1$-$C_{10}$ alkyl group, a hydroxy $C_1$-$C_4$ alkyl group, a $C_1$-$C_3$ alkoxy $C_1$-$C_4$ alkyl group, a di-$C_1$-$C_2$ alkylamino $C_1$-$C_4$ alkyl group or an aryl group, R$^2$ represents a hydrogen atom, a $C_1$-$C_3$ alkoxy group or a di-$C_1$-$C_2$ alkylamino group, or Z and R$^1$ together represent the formula

3. The composition of claim 1 wherein the photosensitizer is N-phenylglycine.
4. The composition of claim 1 wherein the photosensitizer is 2,4,6-tris(trichloromethyl)-1,3,5-triazine.
5. The composition of claim 1 wherein the photosensitizer is a mixture of p-dimethylaminobenzoic acid isopentyl ester and 2,4-diisopropylthioxanthone.
6. The composition of claim 1 wherein the dyestuff is present in the composition in an amount of 0.005 to 0.3 part by weight based on one part by weight of the polymerizable compound.
7. The composition of claim 1 wherein the peroxide is present in the composition in an amount of 0.005 to 0.2 part by weight based on one part by weight of the polymerizable compound.
8. The composition of claim 1 wherein the polymerizable compound has two ethylenically unsaturated bonds per molecule.
9. The composition of claim 8 wherein the polymerizable compound has a boiling point of at least 100° C.
10. The composition of claim 1 wherein the composition further comprises a polymeric binder.

* * * * *

UNITED STATES PATENT AND TRADEMARK OFFICE
CERTIFICATE OF CORRECTION

PATENT NO. : 4,766,055

DATED : August 23, 1988

INVENTOR(S) : Masami KAWABATA, Koichi KIMOTO and Yasuyuki TAKIMOTO

It is certified that error appears in the above-identified patent and that said Letters Patent is hereby corrected as shown below:

Column 3, line 16, change "glycelol" to --glycerol--;

line 21, change "dipentaetythritol" to --dipentaerythritol--.

Column 5, line 40, change "acetyacetone" to --acetylacetone--;

line 51, change "octonoyl" to --octanoyl--;

line 63, change "melain" to --malein--.

Column 6, line 9, change "diisopropylthixanthone" to --diisopropylthioxanthone--.

Column 11, line 14, change "Example 6" to --Example 1--;

line 15, change "Example 6" to --Example 1--.

Signed and Sealed this

Twenty-eighth Day of March, 1989

*Attest:*

DONALD J. QUIGG

*Attesting Officer*      *Commissioner of Patents and Trademarks*